United States Patent [19]
Hotomi et al.

[11] Patent Number: 5,725,825
[45] Date of Patent: Mar. 10, 1998

[54] METHOD OF PRODUCING PIEZOELECTRIC ELEMENT

[75] Inventors: Hideo Hotomi, Nishinomiya; Kenji Masaki, Nagaokakyo; Kusunoki Higashino, Osaka, all of Japan

[73] Assignee: Minolta Co., Ltd., Osaka, Japan

[21] Appl. No.: 677,142

[22] Filed: Jul. 9, 1996

[30] Foreign Application Priority Data

Jul. 11, 1995 [JP] Japan ................... 7-174739

[51] Int. Cl.$^6$ ................... C04B 33/32
[52] U.S. Cl. ............ 264/434; 264/435; 264/436; 264/125; 264/635; 264/618; 264/645; 264/678; 264/328.2
[58] Field of Search ................... 264/63, 328.2, 264/430, 434, 635, 618, 645, 435, 436, 678, 125

[56] References Cited

U.S. PATENT DOCUMENTS

| | | |
|---|---|---|
| 2,305,877 | 12/1942 | Klingler et al. ............ 264/328.2 |
| 3,683,212 | 8/1972 | Zoltan . |
| 4,116,480 | 9/1978 | Rivers .................... 264/63 |
| 4,496,506 | 1/1985 | Sakato et al. .............. 264/63 |
| 4,624,796 | 11/1986 | Giniewicz ................ 252/62.9 |
| 4,900,491 | 2/1990 | Odink .................... 264/313 |

Primary Examiner—James Derrington
Attorney, Agent, or Firm—Burns, Doane, Swecker & Mathis, LLP

[57] ABSTRACT

A method of producing a cylindrical piezoelectric element includes:

(a) injecting the molding fluid containing calcined powder of piezoelectric material in a mold having cylindrical cavity and wire-shaped core inserted therein;
(b) heating to dry the molding fluid injected in the mold so as to obtain cylindrical member;
(d) removing cylindrical member from the mold; and
(e) sintering the cylindrical member to obtain a piezoelectric element.

15 Claims, 6 Drawing Sheets

METHOD OF PRODUCING PIEZOELECTRIC ELEMENT

BACKGROUND OF THE INVENTION

1. Field of the Invention

The present invention relates to a method of producing a piezoelectric element for use in inkjet recording head which discharge ink drops in accordance with image signals to record on a recording medium such as paper or the like. The present invention also relates to the inkjet recording head.

2. Description of the Related Art

Heretofore, so-called Gould-type inkjet recording head is known wherein a piezoelectric element having a cylindrical configuration identical to the cylindrical shape of an ink compartment is arranged on the periphery thereof, and the piezoelectric element is subjected to compression deformation in the diameter direction via voltage applied in accordance with image signals, which increases the pressure exerted on the ink loaded in the ink compartment based on the deformation, and causes ink to be propelled from a nozzle formed at one end of the ink compartment.

This Gould-type inkjet recording head is promising due to capability of low voltage operation, minimum synchronous displacement between each ink compartment, and capability of halftone expression in images.

On the other hand, cylindrical piezoelectric elements used in Gould-type inkjet recording head heretofore have been formed in cylindrical configuration with a machined perforation through the center of the rod-shaped piezoelectric element, and thus even the smallest of the elements has a diameter of about 1 mm. Such an arrangement is disadvantageous inasmuch as it is difficult to improve image resolution and recording speed because ink compartments cannot be arrayed in high density with a multiplicity of nozzles due to the size of the piezoelectric elements.

SUMMARY OF THE INVENTION

An object of the present invention is to provide a novel and useful method of producing cylindrical piezoelectric elements which eliminates the previously described disadvantages.

Another object of the present invention is to provide a method of producing cylindrical piezoelectric elements which allows a high density of multiple nozzles in a Gould-type inkjet recording head.

Still another object of the present invention is to provide a production method capable of producing cylindrical piezoelectric elements having small exterior diameter and interior diameter.

Yet another object of the present invention is to provide a method of producing cylindrical piezoelectric elements with high precision.

Another object of the present invention is to provide a method of producing cylindrical piezoelectric elements which effectively simplifies the manufacturing process and reduces cost.

Another object of the present invention is to provide a inkjet recording head which is able to obtain a high image density.

Another object of the present invention is to provide a inkjet recording head which is capable of low voltage operation.

Another object of the present invention is to provide a inkjet recording head which has minimum synchronous displacement between each ink compartment.

These objects are attained by the present invention providing a method of producing a cylindrical piezoelectric element comprising:

(a) injecting a molding fluid in a mold having cylindrical cavity and wire-shaped core inserted therein, said molding fluid being prepared by dispersing a calcined powder of piezoelectric material in a solvent containing dissolved coupling agent;

(b) heating to dry the molding fluid injected in the mold so as to obtain cylindrical member;

(c) removing cylindrical member from the mold; and (d) sintering the cylindrical member to obtain a piezoelectric element.

These objects are attained by the present invention providing an inkjet printing head comprises:

(a) a plurality of cylindrical piezoelectric elements which have diameter of not more than 1 μm and line with a pitch of 1 μm, said element having electrodes on the interior and exterior surface thereof;

(b) ink supplier for supplying ink to the piezoelectric element; and (c) nozzle for discharging ink drops.

BRIEF DESCRIPTION OF THE DRAWINGS

In the following description, like parts are designated by like reference numbers throughout the several drawings.

DESCRIPTION OF THE PREFERRED EMBODIMENTS

The preferred embodiments of the present invention are described hereinafter with reference to the accompanying drawings.

Figure 1:
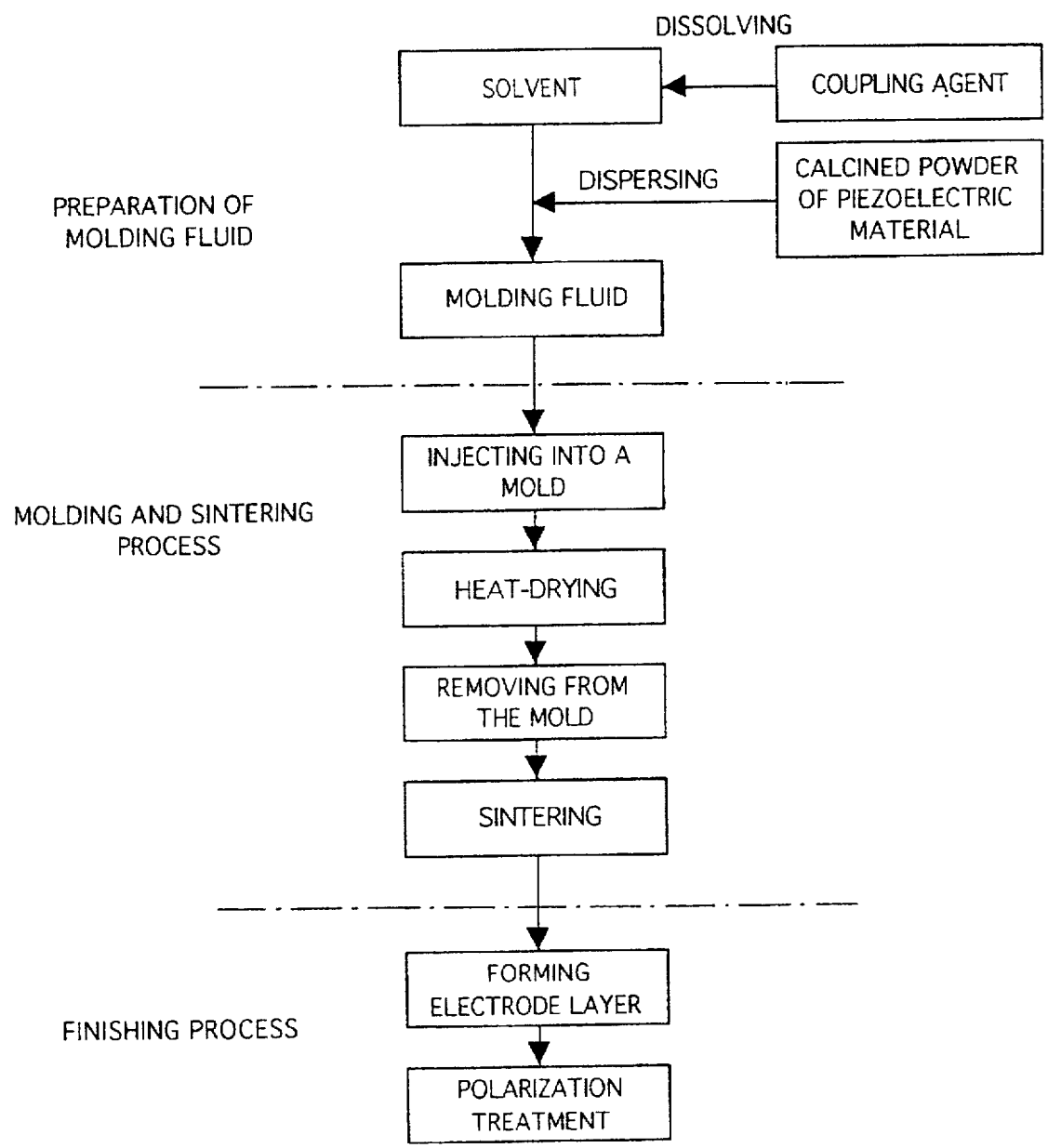
FIG. 1 shows procedure of a production method of cylindrical piezoelectric element as an embodiment of the present invention.

FIG. 1 shows procedure of a production method of a cylindrical piezoelectric element as an embodiment of the present invention. As shown in FIG. 1, the method of producing a cylindrical piezoelectric element of this embodiment includes processes such as preparation of a molding fluid, injection molding, heat-drying, removal from the mold, sintering, electrode formation, and polarization process.

The molding fluid may be prepared by dissolving a coupling agent in a solvent, and thereafter adding calcined powder of piezoelectric material and achieving a uniform dispersion using a mixing device such as a ball mill to obtain a paste.

Examples of useful coupling agents include hydrophilic coupling agents having water solubility and water-swelling characteristics (e.g., Na-carboxymethyl cellulose, polyvinyl alcohol and the like), hydrophilic coupling agents having water solubility and organic solvent solubility (e.g., hydroxypropyl cellulose, polyethylene glycol and the like), or hydrophobic coupling agents having organic solvent solubility (e.g., ethyl cellulose, polyvinyl acetate and the like).

The solvent for dissolving the coupling agent may be selected in accordance with the characteristics of the coupling agent. For example, a hydrophilic organic solvent or water may be selected when using a hydrophilic coupling agent, and a hydrophobic organic solvent may be selected when using a hydrophobic coupling agent. General organic solvent, for example, toluene, acetone, xylene, propanol and the like may be used.

Although representative materials such as powder mixtures of lead zirconate and lead titanate $(pb(Zr_xTi_{x-1})O_3)$ may be used as the calcined powder of piezoelectric material, various types of well known materials may also be used.

The particle size of the calcined powder of piezoelectric material may be suitably selected so as to have the required strength to form the wall portion of the cylindrical piezoelectric element without mutual contact among individual cylindrical piezoelectric elements when the cylindrical piezoelectric elements are arranged at a pitch to achieve a required resolution. For example, the particle size may be in a range of 0.01 to 20 μm, and preferably 0.015 to 13 μm, when producing cylindrical piezoelectric elements for use at 50 to 600 dpi.

The mixture ratio of calcined powder of piezoelectric material and solvent with dissolved coupling agent is desirably in a weight ratio range of from 2:8 to 9:1, and preferably 4:6 to 8:2.

Figure 2:
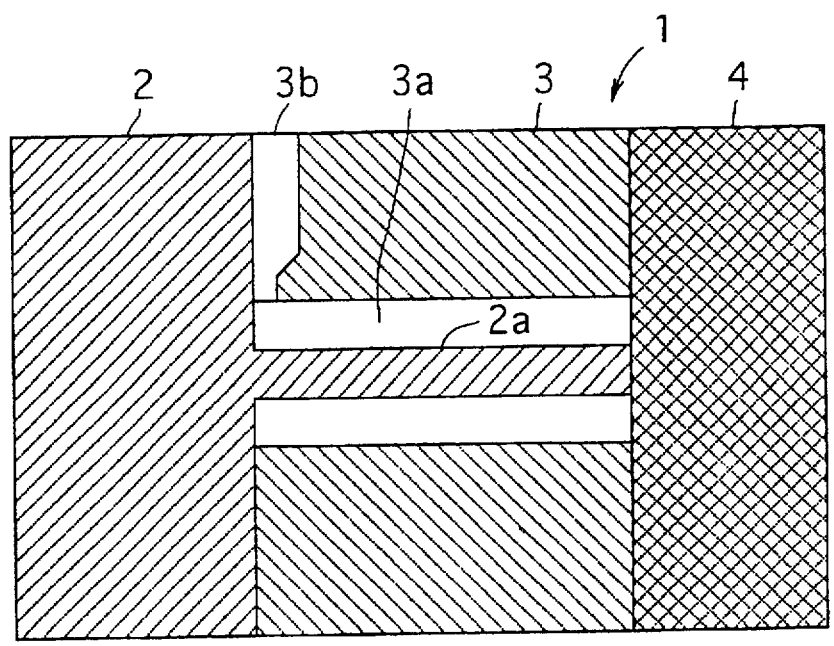
FIG. 2 is a section view of a mold applicable to the method of production of a cylindrical piezoelectric element.

The prepared molding fluid is injected into a mold. FIG. 2 is a section view of a mold 1 capable of forming a cylindrical member. As shown in FIG. 2, mold 1 comprises a trimming mold 2 having a wire portion 2a for forming the hollow center of the cylindrical member, cylinder mold 3 which forms a cylindrical shaped cavity 3a on the periphery of wire portion 2a and has an injection aperture 3b passing through to cavity 3a, and seal mold 4 which seal one end of cavity 3a. Although the material of the mold 1 is not specifically limited insofar as the material is able to withstand a heat-drying or sintering process described later, metallic materials such as stainless steel are suitable.

The molding fluid is injected through injection aperture 3b into the assembled mold 1 as shown in FIG. 2, then the molding fluid is solidified by heat-drying to produce a cylindrical member which is then removed from the mold. The heat-drying temperature and time interval thereof are suitably set in accordance with the mixture ratio of the calcined powder and solvent.

The cylindrical member thus obtained is subjected to sintering to produce a cylindrical piezoelectric element. A sintering temperature within a range of 500° to 2,000° C. is suitable. The sintering of the cylindrical member may be performed also before removal from the mold.

Examples of cylindrical piezoelectric elements having an external diameter of 200 μm, internal diameter of 100 μm, and length of 4 mm for use at 600 dpi produced using the mold 1 are described below.

First, ethyl cellulose used as a coupling agent is dissolved in toluene used as a solvent. A calcined powder (particle size 0.5 μm) of piezoelectric material PZT $(Pb(Zr_{0.48}Ti_{0.52})O_3)$ is loaded in the toluene solution containing the coupling agent, and thoroughly dispersed using a ball mill to produce a paste as a molding fluid. At this time, the mixture ratio of PZT calcined powder and toluene containing ethylcellulose is set at a weight ratio of 7:3. This molding fluid is injected into mold 1 from injection aperture 3b, and heated at 100° C. for 1 hr for molding to dry and solidify the molding fluid. Thus, cylindrical member is obtained.

Then, the trimming mold 3 is removed from cylinder mold 3, and the solidified cylindrical member is removed from cylinder mold 3. Thereafter, the molded cylindrical member is placed in a high temperature oven and sintered at 1,100° C. in a lead gas atmosphere for 2 hr to produce a cylindrical piezoelectric element.

After the sintering, electrode layer is formed on the surface of the cylindrical piezoelectric element. As the method for forming the electrode layer, a method which forms an Au/Ni film or Au/(Ni,Cr) film via a plating, spattering or the like can be used. When forming the electrode layer, the bilateral ends of the cylindrical piezoelectric element should be masked, or bilateral end should be cut after plating or spattering on whole surface of the cylindrical member, so as to electrically insulate the interior electrode layer from the exterior electrode layer of the cylindrical member.

Thereafter, the cylindrical piezoelectric element is subjected to polarization treatment. If the polarization treatment used is a well known method, e.g., a method wherein a high voltage is applied via each electrode layer with heating.

According to the method for producing a cylindrical piezoelectric element described above, a cylindrical piezoelectric element having very small exterior diameter and interior diameter compared to conventional piezoelectric elements among which even the smallest of said elements has an exterior diameter of about 1 mm can be easily produced with high precision.

Figure 3:
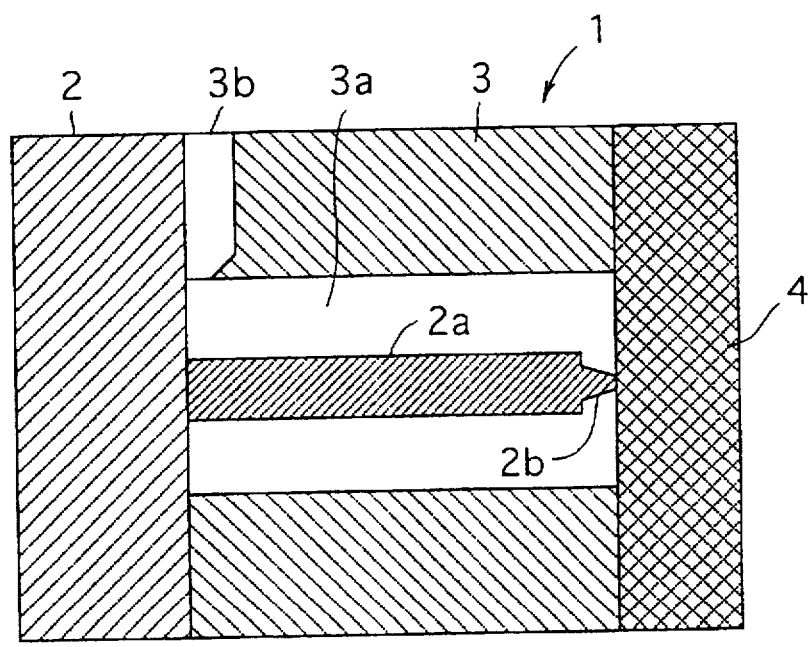
FIG. 3 shows a modification of the mold.

As shown in FIG. 3, if a protrusion 2b is formed beforehand in the same shape as a nozzle at the tip of wire portion 2a of trimming mold 2, it is possible to simultaneously form an integrated nozzle on the end of the cylindrical piezoelectric element. Accordingly, it becomes unnecessary to provide a separate nozzle plate (described later), thereby simplifying the manufacturing process and reducing costs.

When forming a cylindrical piezoelectric element using mold 1, the molding fluid may also be injected into cylinder mold 3 with trimming mold 2 removed, and subsequently inserting trimming mold 2.

Further, although a production method of general ceramic tube may be adapted for use as a method of producing a cylindrical piezoelectric element, wire portion 2a may be used as an electrode for the polarization treatment if a high voltage is applied to the cylindrical piezoelectric element via wire portion 2a of trimming mold 2 which is inserted into the hollow center of the cylindrical piezoelectric element. Accordingly, the aforementioned production method is specifically suitable for production of a piezoelectric element, and effectively simplifies the manufacturing process and reduces costs.

The construction of inkjet recording head 10 using cylindrical piezoelectric elements 14 produced by the previously described method, and the ink discharge operation of the inkjet recording head 10 are described below with reference to FIGS. 4 and 5.

Inkjet recording head 10 is provided with a base plate 11, ink manifold 12 provided on the base plate 11, and ink supply unit 20 connected to ink manifold 12. Within ink manifold 12 are interconnectedly formed a rectangular hole 12b used by ink supply compartment 12a, and rectangular hole 12c used to anchor cylindrical piezoelectric element 14 and which has a larger cross section than hole 12b.

A orifice plate 13 is mounted to the end of cylindrical piezoelectric element 14. Orifice plate 13 is provided with a plurality of ink supply apertures 13a formed at a predetermined pitch along a direction perpendicular to the paper surface in FIG. 3, and a plurality of cylindrical piezoelectric elements 14 are arrayed parallel to each ink supply aperture 13a. The array pitch of the plurality of cylindrical piezoelectric elements 14 matching the pitch of the formed ink supply apertures 13a is set within a range of 508 to 42.3 μm to correspond to a pixel density of 50 to 600 dpi; in the present embodiment, the pitch is set at 254 μm to correspond to 100 dpi.

On the other hand, nozzle plates 15 having nozzle holes 15a are attached to the other end of the plurality of cylindrical piezoelectric elements 14. Nozzle hole 15a has a cross sectional area which is larger on the ink compartment 16 side, and is tapered so as to be smaller on the exterior surface. This configuration is effective in making it difficult for air bubbles to be pulled into the interior of the ink compartment 16. The smoothness of the ink flow and the ink discharge stability are improved if the edge of nozzle hole 15a is subjected to ink-repellent treatment.

The ends of a plurality of cylindrical piezoelectric elements 14 to which is attached the orifice plate 13 are inserted in rectangular hole 12c of ink manifold 12, such that orifice plate 13 abuts the boundary of rectangular hole 12b. Thus, the hollow portion of cylindrical piezoelectric element 14 and ink supply compartment 12a are connected via ink supply apertures 13a and form an ink compartment 16 having at one end a nozzle hole 15a on the interior portion of each cylindrical piezoelectric element 14.

Although it is desirable that nozzle plate 15 is provided for each cylindrical piezoelectric element 14 to prevent synchronous displacement between the ink compartments 16, the number of components can be reduced and component assembly simplified if the nozzle plates are integratedly formed as a single unit attached consecutively to the plurality of cylindrical piezoelectric elements 14.

Figure 4:
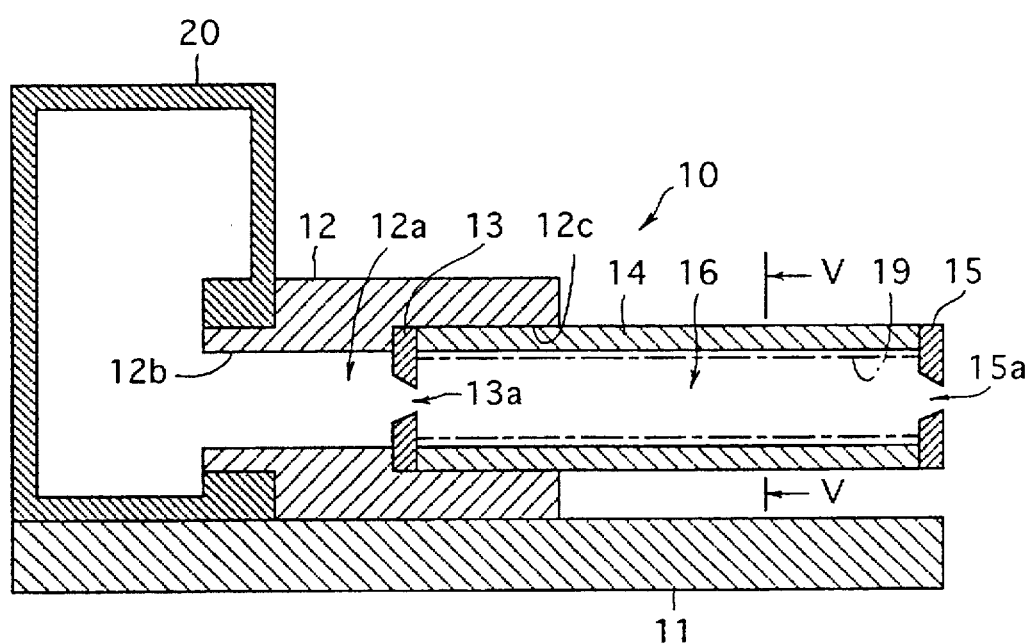
FIG. 4 is a longitudinal section view of an inkjet recording head using a cylindrical piezoelectric element.
Figure 5:
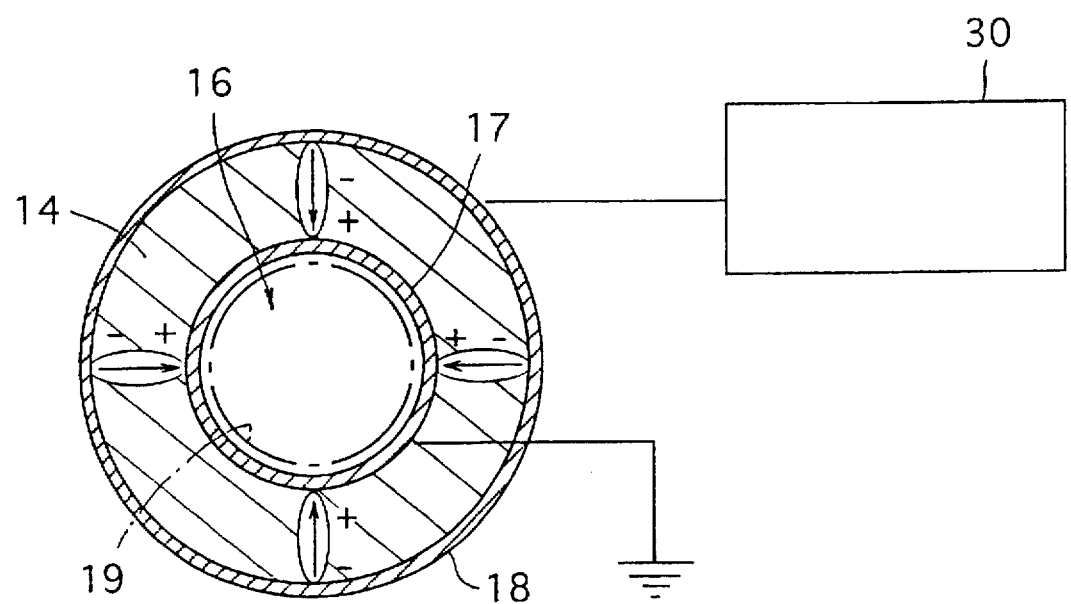
FIG. 5 is an enlarged section view of the V—V line of the cylindrical piezoelectric element of FIG. 4.

FIG. 5 shows an enlarged section view on the V—V line of the cylindrical piezoelectric element 14 of FIG. 4. The interior surface of cylindrical piezoelectric element 14 is provided with first electrode layer 17, and the exterior surface of the element 14 is provided with a second electrode layer 18, the first and second electrodes 17 and 18 being electrically isolated. First electrode 17 is grounded. The second electrode 18 is connected to a driver 30, so as to apply voltage to cylindrical piezoelectric element 14 via driver 30 in accordance with image signals. An overcoat layer 19 is formed on the formed surface of first electrode 17 via application of, for example, epoxy resin by spin coating method followed by heat-treatment, so as to prevent reduction of resistance caused by penetration of the ink to the piezoelectric element and reduction of the amount of deformation when voltage is applied. Cylindrical piezoelectric element 14 is subjected to polarization treatment wherein the element 14 is polarized in the diameter direction from second electrode 18 toward first electrode 17.

The ink discharge operation of the inkjet recording head 10 is described below.

As shown in FIG. 4, ink is supplied from ink supply unit 20 to ink supply compartment 12a of ink manifold 12, and is loaded into ink compartment 16 via ink supply aperture 13a.

Figure 6:
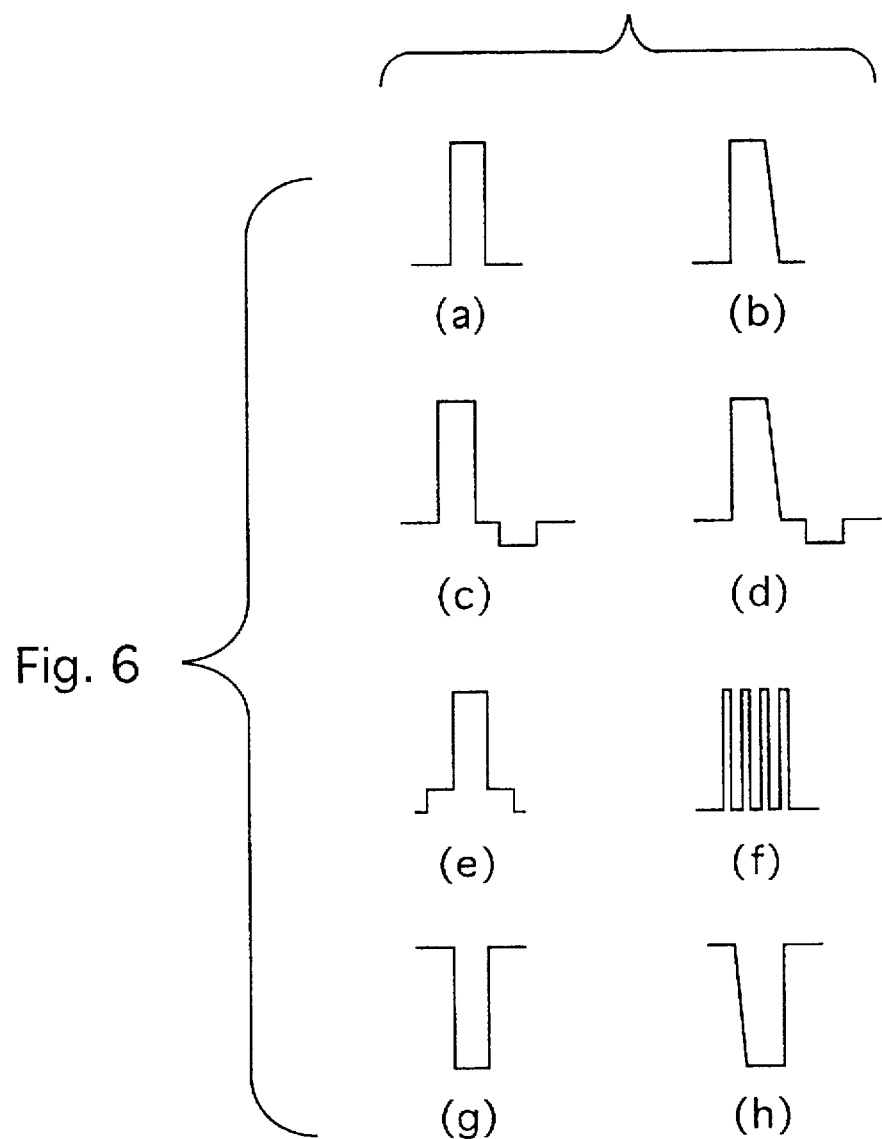
FIG. 6 (a–h) shows the waveform of the pulse voltage applied to the cylindrical piezoelectric element.

When the pulse voltage of the positive polarity shown in FIG. 6(a) is applied to cylindrical piezoelectric element 14 via driver 30, an electric field is formed in the interior of the element 14 in the diameter direction from second electrode 18 toward first electrode 17, i.e., parallel to the polarization direction, such that cylindrical piezoelectric element 14 is subjected to compression deformation via a so-called diameter direction oscillation mode.

When a pulse voltage is applied to the cylindrical piezoelectric element 14, the internal diameter of the element 14 is momentarily contracted via compression deformation. The capacity of ink compartment 16 is thus reduced by the deformation, so as to increase the pressure on the ink contained therein. Therefore, the pressured ink is discharged as liquid droplets from ink nozzle 15a and adhered to a recording sheet not shown in the illustration.

When the voltage application is discontinued after ink is discharged as described above, the cylindrical piezoelectric element 14 is restored to its original shape based on the elasticity of the element 14. At this time, the capacity of the ink compartment 16 increases and creates a negative pressure within the element 14, such that ink is resupplied to ink compartment 16 via ink manifold 12 and ink supply aperture 13a in preparation for a subsequent ink discharge.

As shown in FIG. 6(b), if the pulse shape is inclined when cylindrical piezoelectric element 14 is restored so as to return cylindrical piezoelectric element 14 as rapidly as possible within a range which does not produce attraction of air bubbles from the nozzle 15a to ink compartment 16, it is possible to prevent concern of preventing ink discharge due to pressure absorption by air bubbles during a next pulse voltage application.

If, as shown in FIGS. 6(c) and 6(d), a pulse voltage comprising a main pulse voltage followed by a smaller after pulse of opposite polarity is applied to cylindrical piezoelectric element 14, an ink column extending from ink nozzle 15a after ink is discharged via the main pulse can be forcibly pulled back into ink compartment 16 by the slight increase in capacity if ink compartment 16 induced by the after pulse, thereby reducing satellite noise. The reason that falling portion of the main pulse in the pulse form shown in FIG. 6(d) is inclined is identical to that of FIG. 6(b).

If a square pulse voltage is applied in the form of a normally uniform low voltage, as shown in FIG. 6(e), it is possible to reduce the voltage necessary for ink discharge, thereby reducing driver costs. If an AC component is added to the pulse voltage in accordance with image signals at intervals, as shown in FIG. 6(f), ink cutoff is excellent.

The ink discharge operation is accomplished independently for each ink compartment 16, such that an image is drawn in line segments corresponding to the number of nozzles 15a via movement of scanning carriage (not shown), aforementioned operation being repeated simultaneously with movement in the transport direction of the recording sheet so as to record an image in accordance with image signals on a recording sheet.

Although ink is discharged when a pulse voltage of positive polarity is applied to cylindrical piezoelectric element 14 in inkjet recording head 10, it is to be noted that a pulse voltage of polarity opposite to that shown in FIGS. 6(a) and 6(b) may be applied to cylindrical piezoelectric element 14 as shown in FIGS. 6(h) and 6(g). In this case, the capacity of ink compartment 16 is increased when the voltage is ON so as to resupply ink, and ink is discharged when the piezoelectric element is restored to its original shape when the voltage is OFF. The reason that falling portion of the pulse shown in FIG. 6(h) is inclined is identical to that of FIG. 6(b).

Although the present invention has been fully described by way of examples with reference to the accompanying drawings, it is to be noted that various changes and modifications will be apparent to those skilled in the art.

Therefore, unless otherwise such changes and modification depart from the scope of the present invention, they should be construed as being included therein.

What is claimed is:

1. A method of producing a cylindrical piezoelectric element having a hollow center comprising:
   (a) injecting a molding fluid in a mold having cylindrical cavity and wire-shaped core inserted therein, said molding fluid being prepared by dispersing a calcined powder of piezoelectric material in a solvent containing dissolved coupling agent;
   (b) heating to dry the molding fluid injected in the mold so as to obtain a cylindrical member;
   (c) removing the cylindrical member from the mold; and
   (d) sintering the cylindrical member to obtain a piezoelectric element.

2. The method as claimed in claim 1 wherein said coupling agent comprises a compound selected from the group consisting of hydrophilic coupling agents having water solubility and water-swelling characteristics, hydrophilic coupling agents having water solubility and organic solvent solubility, and hydrophobic coupling agents having organic solvent solubility.

3. The method as claimed in claim 1 wherein said solvent comprises a material selected from the group consisting of water, hydrophilic organic solvents, and hydrophobic organic solvents.

4. The method as claimed in claim 1 wherein said calcined powder comprises a mixture of lead zirconate and lead titanate.

5. The method as claimed in claim 1 wherein said calcined powder has average diameter of 0.01 to 20 μm.

6. The method as claimed in claim 1 wherein the weight ratio of calcined powder and solvent containing the coupling agent is in a range of 2:8 to 9:1.

7. The method as claimed in claim 1 wherein the heating is performed at a temperature in the range between 500° and 2,000° C.

8. The method as claimed in claim 1 which further comprises forming electrode layers on the interior and exterior surfaces of the cylindrical member.

9. The method as claimed in claim 8 wherein the electrode formation comprises:
   (a) forming electrode layer on the whole surface of the cylindrical member; and
   (b) electrically insulating the electrode layer formed on the interior surface from the electrode layer formed on the exterior surface by cutting and removing the edge portion of the cylindrical member.

10. The method as claimed in claim 8 wherein the electrode formation comprises:
    (a) masking edge portion of the cylindrical member;
    (b) forming electrode layer on the whole surface of the masked cylindrical member; and
    (c) unmasking the cylindrical member in which the electrode is formed on the surface thereof.

11. The method as claimed in claim 1 which further comprises polarizing the piezoelectric element by applying electric voltage with heating.

12. The method as claimed in claim 1 wherein said core being inserted after filling the cavity with the molding fluid.

13. The method as claimed in claim 1 wherein said core is used as a electrode for the polarization of the piezoelectric element.

14. The method as claimed in claim 1 wherein the sintering of the cylindrical member is performed before the removal from the mold.

15. The method as claimed in claim 1 wherein said core has a tapering tip.

* * * * *